(12) United States Patent
VanGilder

(10) Patent No.: US 11,582,887 B2
(45) Date of Patent: Feb. 14, 2023

(54) METHODS OF BALANCING AIRFLOW IN CEILING-DUCTED CONTAINMENT SYSTEMS

(71) Applicant: SCHNEIDER ELECTRIC IT CORPORATION, Foxboro, MA (US)

(72) Inventor: James William VanGilder, Pepperell, MA (US)

(73) Assignee: SCHNEIDER ELECTRIC IT CORPORATION, Foxboro, MA (US)

(*) Notice: Subject to any disclaimer, the term of this patent is extended or adjusted under 35 U.S.C. 154(b) by 431 days.

(21) Appl. No.: 16/617,749

(22) PCT Filed: Jul. 17, 2019

(86) PCT No.: PCT/US2019/042113
§ 371 (c)(1),
(2) Date: Nov. 27, 2019

(87) PCT Pub. No.: WO2020/018612
PCT Pub. Date: Jan. 23, 2020

(65) Prior Publication Data
US 2020/0359532 A1 Nov. 12, 2020

Related U.S. Application Data

(60) Provisional application No. 62/779,961, filed on Dec. 14, 2018, provisional application No. 62/699,237, filed on Jul. 17, 2018.

(51) Int. Cl.
*H05K 7/20* (2006.01)
*G06F 1/20* (2006.01)
*G05B 13/04* (2006.01)

(52) U.S. Cl.
CPC ....... *H05K 7/20745* (2013.01); *G05B 13/041* (2013.01); *G06F 1/206* (2013.01);
(Continued)

(58) Field of Classification Search
CPC .... F24F 11/0001; F24F 11/74; F24F 13/1426; F24F 13/16; F24F 2013/1473;
(Continued)

(56) References Cited

U.S. PATENT DOCUMENTS 8,473,265 B2   6/2013   Hlasny et al.
8,825,451 B2   9/2014   VanGilder et al.
(Continued)

OTHER PUBLICATIONS

Raissa Carey, The Airflow Containment Thermal Revolution Aug. 7, 2014, An IoT World, https://www.missioncriticalmagazine.com/articles/86755-the-airflow-containment-thermal-revolution, p. 1-6 (Year: 2014).*

(Continued)

*Primary Examiner* — Kidest Bahta
(74) *Attorney, Agent, or Firm* — Lando & Anastasi, LLP

(57) ABSTRACT

One aspect is directed to a system for controlling airflow in a facility having a ceiling-ducted aisle airflow containment system having a first damper system for controlling airflow. The system includes an input to receive parameters related to airflow in the facility, wherein the parameters include at least one airflow resistance value for a device in the facility, an output to provide output data including at least one setting for one or more controllable devices in the facility, and one or more processors configured to receive the parameters related to airflow, determine airflow values associated with the airflow containment system and based on the airflow values, generate the at least one setting for the one or more controllable devices, including at least one setting for the first damper system.

20 Claims, 11 Drawing Sheets

(52) U.S. Cl.
CPC ..... H05K 7/20145 (2013.01); H05K 7/20209 (2013.01); *G05B 2219/2614* (2013.01)

(58) Field of Classification Search
CPC ............... F24F 2140/10; G05B 13/041; G05B 2219/2614; G06F 1/206; H05K 7/20145; H05K 7/20209; H05K 7/20745
See application file for complete search history.

(56) References Cited

U.S. PATENT DOCUMENTS

| | | | |
|---|---|---|---|
| 8,996,180 | B2 | 3/2015 | VanGilder et al. |
| 9,392,733 | B2 | 7/2016 | Day |
| 9,494,985 | B2 | 11/2016 | Rasmussen et al. |
| 9,727,064 | B2 | 8/2017 | VanGilder et al. |
| 9,830,410 | B2 | 11/2017 | VanGilder |
| 9,874,362 | B2 | 1/2018 | Douglas |
| 10,034,417 | B2 | 7/2018 | Billet et al. |
| 10,102,313 | B2 | 10/2018 | VanGilder et al. |
| 10,274,978 | B2 | 4/2019 | VanGilder et al. |
| 10,375,864 | B2 | 8/2019 | Dawson |
| 10,614,194 | B2 | 4/2020 | Shrivastava et al. |
| 2010/0188816 | A1* | 7/2010 | Bean, Jr. ............ H05K 7/20745 361/696 |
| 2013/0062047 | A1 | 3/2013 | Vaney et al. |
| 2013/0078901 | A1 | 3/2013 | Curtin et al. |
| 2017/0347497 | A1* | 11/2017 | LeFebvre ............ H05K 7/20745 |
| 2018/0014428 | A1 | 1/2018 | Slessman et al. |
| 2018/0168073 | A1* | 6/2018 | Vaney ................. H05K 7/20836 |
| 2019/0045669 | A1* | 2/2019 | Dawson ............. H05K 7/20836 |

OTHER PUBLICATIONS

Edmonds, Jack et al, "Theoretical Improvements in Algorithmic Efficiency for Network Flow Problems," Journal of the Association for Computing Machinery, vol. 19, No. 2, Apr. 1972, pp. 248-264.

Erden, Hamza Salih et al., "Experimental Demonstration and Flow Network Model Verification of CRAH Bypass Technique for Cooling Optimization of Enclosed Aisle Data Centers," IEEE Transactions On Components, Packaging and Manufacturing Technology, vol. x, No. x, Month 2016, pp. 1-8.

Kang, Sukhwinder et al., "A Methodology for the Design of Perforated Tiles in Raised Floor Data Centers Using Computational Flow Analysis," 2000 IIEEE, Inter Society Conference on Thermal Phenomena , pp. 215-224.

Notification of Transmittal of the International Search Report and the Written Opinion of the International Searching Authority from corresponding PCT/US2019/042113 dated Oct. 24, 2019.

Shrivastava, Saurabh K. et al., "A Flow-Network Model for Predicting Rack Cooling in Containment Systems," Proceedings of IPACK2009, InterPACK'09, Jul. 19-23, 2009, San Francisco, CA, USA, pp. 1-7.

Tozer, Robert et al., "Air Management Metrics In Data Centers," CH-09-009, 2009 ASHRAE, vol. 115, Part 1, pp. 1-7.

Vangilder, James W. et al., "Cooling Performance of Ceiling-Plenm-Ducted Containment Systems in Data Centers," 14th IEEE ITHERM Conference, pp. 786-792.

Vangilder, James W., "A Hybrid Flow Network-CFD Method for Achieving Any Desired Flow Partitioning Through Floor Tiles of a Raised-Floor Data Center," InterPACK2003-35171, Proceedings of InterPACK'03, International Electronic Packaging Technical Conference and Exhibition, Maui, Hawaii, USA, Jul. 6-11, 2003, pp. 1-6.

Zhang, Xuanhang (Simon) et al., "A Real-Time Data Center Airflow and Energy Assessment Tool," IPACK2009-89175, Proceedings of IPACK2009, InterPACK'09, Jul. 19-23, 2009, San Francsco, CA, USA, pp. 1-6.

Zhang, Xuanhang (Simon) et al., "Compact Modeling of Data Center Air Containment Systems," InterPACK2013-73325, Proceedings of the ASME 2013 International Technical Conference and Exhibition on Packaging and Integration of Electronic and Photonic Systems, InterPACK2013, Jul. 16-18, 2013, Burlingam, CA, USA, pp. 1-6.

Extended European Search Report from corresponding European Application No. 19838790.4 dated Mar. 31, 2022.

* cited by examiner

METHODS OF BALANCING AIRFLOW IN CEILING-DUCTED CONTAINMENT SYSTEMS

CROSS-REFERENCE TO RELATED APPLICATION

This application is a U.S. National Stage Application under 35 U.S.C. § 371 of International Application No. PCT/US2019/042113, filed Jul. 17, 2019, titled METHODS OF BALANCING AIRFLOW IN CEILING-DUCTED CONTAINMENT SYSTEMS, which claims the benefit under 35 U.S.C. § 119(e) of U.S. Provisional Application No. 62/699,237, filed Jul. 17, 2018, titled METHODS OF BALANCING AIRFLOW IN CEILING-DUCTED CONTAINMENT SYSTEMS and U.S. Provisional Application No. 62/779,961, filed Dec. 14, 2018, titled METHODS OF BALANCING AIRFLOW IN CEILING-DUCTED CONTAINMENT SYSTEMS, all of which are hereby incorporated by reference in their entireties for all purposes.

CROSS-REFERENCE TO RELATED APPLICATION

This application claims priority to U.S. Provisional Application Ser. No. 62/699,237 titled "Methods of Balancing Airflow In Ceiling-Ducted Hot-Aisle Containment Systems," filed on Jul. 17, 2018, and claims priority to U.S. Provisional Application Ser. No. 62/779,961 titled "Methods of Balancing Airflow In Ceiling-Ducted Hot-Aisle Containment Systems," filed on Dec. 14, 2018 both of which are incorporated herein by reference in their entirety.

BACKGROUND OF INVENTION

Field of the Invention

At least one embodiment in accordance with the present disclosure relates generally to systems and methods for air containment management and design, and more specifically, to systems and methods for managing power consumption of cooling equipment related to air containment systems for data centers.

Discussion of Related Art

Centralized data centers for computer, communications, and other electronic equipment contain numerous racks of equipment that require power, cooling, and connections to external communication facilities. Data centers remain one of the largest and fastest growing consumers of electricity in the United States. For example, data centers are projected to consume on the order of 140 billion kilo Watt-hours (kWh) per year of electricity by 2020. Additionally, the current trend in data center design is to increase power density, delivering more power per rack of computing equipment. Increased density of computing equipment puts strains on the cooling and power systems that service these facilities.

As power is consumed by computer equipment it is often converted to heat. As a result, the cooling requirements of a facility generally scale with the power consumption. Typical data centers utilize air plenums under raised floors, or in overhead spaces to distribute cooling air through a data center. One or more computer room air conditioners (CRACs) or computer room air handlers (CRAHs) are typically distributed along the periphery or inline of existing equipment within the data room. Perforated tiles may be placed in front, above, or beneath racks of equipment that are to be cooled to allow the cooling air from beneath the floor, from the ceiling, or adjacent to cool equipment within the racks. In addition, some data centers utilize contained hot aisles between rows of racks of equipment with air in the hot aisles ducted to a ceiling duct for return to a CRAH.

SUMMARY

Systems and methods of balancing airflow in ceiling-ducted containment systems are provided. A method of balancing airflow in ceiling-ducted hot-aisle containment systems may comprise, receiving a plurality of differential pressure measurements from one or more pressure sensors contained in one or more hot aisle structures, determining which hot aisle structures have reached a pressure threshold, adjusting a Cooling Room Air Handler (CRAH) associated with a hot aisle structure based on the determined threshold air pressure, determining a pressure change at the associated hot aisle structure resulting from the CRAH adjustment, and adjusting a damper associated with the one or more hot aisle structures based on the determined pressure change.

One aspect is directed to a system for controlling airflow in a facility having a ceiling-ducted aisle airflow containment system having a first damper system for controlling airflow. The system includes an input to receive parameters related to airflow in the facility, wherein the parameters include at least one airflow resistance value for a device in the facility, an output to provide output data including at least one setting for one or more controllable devices in the facility, and one or more processors configured to receive the parameters related to airflow, determine airflow values associated with the airflow containment system and based on the airflow values, generate the at least one setting for the one or more controllable devices, including at least one setting for the first damper system.

In the system, the ceiling-ducted aisle airflow containment system may include two containment pods, including a first containment pod and a second containment pod, the first containment pod having the first damper system and the second containment pod having a second damper system, wherein the one or more processors is configured to generate at least one setting for the second damper system. The facility may include at least one cooling device, and the one or more processors may be further configured to generate at least one setting for the cooling device based on the airflow values. The at least one cooling device may include a fan, and the one or more processors may be configured to generate a fan speed setting for the fan. The first containment pod may include a first pressure sensor and the second containment pod may include a second pressure sensor, and the input may be configured to receive a first measured pressure value from the first sensor and a second measured pressure value from the second sensor and generate the at least one setting for the first damper system and the at least one setting for the second damper system based on the first measured sensor value and the second measured sensor value. The one or more processors may be configured to determine a first model pressure value associated with the first containment pod and a second model pressure value associated with the second containment pod using a model of the data center, and compare the first model pressure value and the second model pressure value with the first measured pressure value and the second measured pressure value to obtain a comparison result. The system may further include a user interface, wherein the user interface includes at least one control configured to receive input from a user to adjust parameters of at least one model. The one or more processors may be configured to adjust parameters of at least one model based on the comparison result.

Another aspect is directed to a non-transitory computer-readable medium storing thereon sequences of computer-executable instructions for controlling airflow in a facility. The sequences of computer-executable instructions including instructions that instruct at least one processor to receive parameters related to airflow in the facility, wherein the parameters include at least one airflow resistance value for a device in the facility, determine airflow values associated with an airflow containment system in the facility, the airflow containment system including a first damper system, and based on the airflow values, generate at least one setting for the one or more controllable devices contained in the facility, including at least one setting for the first damper system.

The ceiling-ducted aisle airflow containment system may include two containment pods, including a first containment pod and a second containment pod, the first containment pod having the first damper system and the second containment pod having a second damper system, and the instructions to instruct the at least one processor may further include instructions to generate at least one setting for the second damper system. The facility may include at least one cooling device, and the instructions to instruct the at least one processor may further include instructions to generate at least one setting for the cooling device based on the airflow values. The at least one cooling device may include a fan, and the instructions to instruct the at least one processor may include instructions to generate a fan speed setting for the fan. The first containment pod may include a first pressure sensor and the second containment pod may include a second pressure sensor, and the instructions to instruct the at least one processor may include instructions to receive a first measured pressure value from the first sensor and a second measured pressure value from the second sensor and generate the at least one setting for the first damper system and the at least one setting for the second damper system based on the first measured sensor value and the second measured sensor value. The instructions to instruct the at least one processor may include instructions to determine a first model pressure value associated with the first containment pod and a second model pressure value associated with the second containment pod using a model of the data center, and compare the first model pressure value and the second model pressure value with the first measured pressure value and the second measured pressure value to obtain a comparison result. The instructions to instruct the at least one processor may include instructions to generate a user interface having at least one control configured to receive input from a user to adjust parameters of at least one model. The instructions to instruct the at least one processor may include instructions to adjust parameters of at least one model based on the comparison result.

Another aspect is directed to a method of balancing airflow in a facility having a ceiling-ducted hot aisle containment system. The method includes receiving a plurality of differential pressure measurements from a plurality of pressure sensors each associated with one of a plurality of hot aisle structures, identifying that at least one hot aisle structure of the plurality of hot aisle structures has a differential pressure greater than a threshold level, providing control signals to adjust a Cooling Room Air Handler (CRAH) associated with the ceiling-ducted hot aisle containment system based on the plurality of differential pressure measurements, receiving a differential pressure measurement for a first hot aisle structure of the plurality of hot aisle structures after a CRAH adjustment, and providing control signals to control a first damper associated with the first hot aisle structure.

In the method, one or more of the plurality of hot aisle structures may include a damper, and the method may include initially setting the damper of one or more of the plurality of hot aisle structures to a maximum open position. In the method, providing control signals to control the CRAH may include iteratively decreasing a fan rate of the CRAH until at least one of the plurality of hot aisle structures has a differential pressure less than the threshold level. In the method, providing control signals to control the CRAH may include iteratively increasing a fan rate of the CRAH until at least one of the plurality of hot aisle structures has sufficient airflow based on differential pressure measurements.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments and are incorporated in and constitute a part of this specification but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
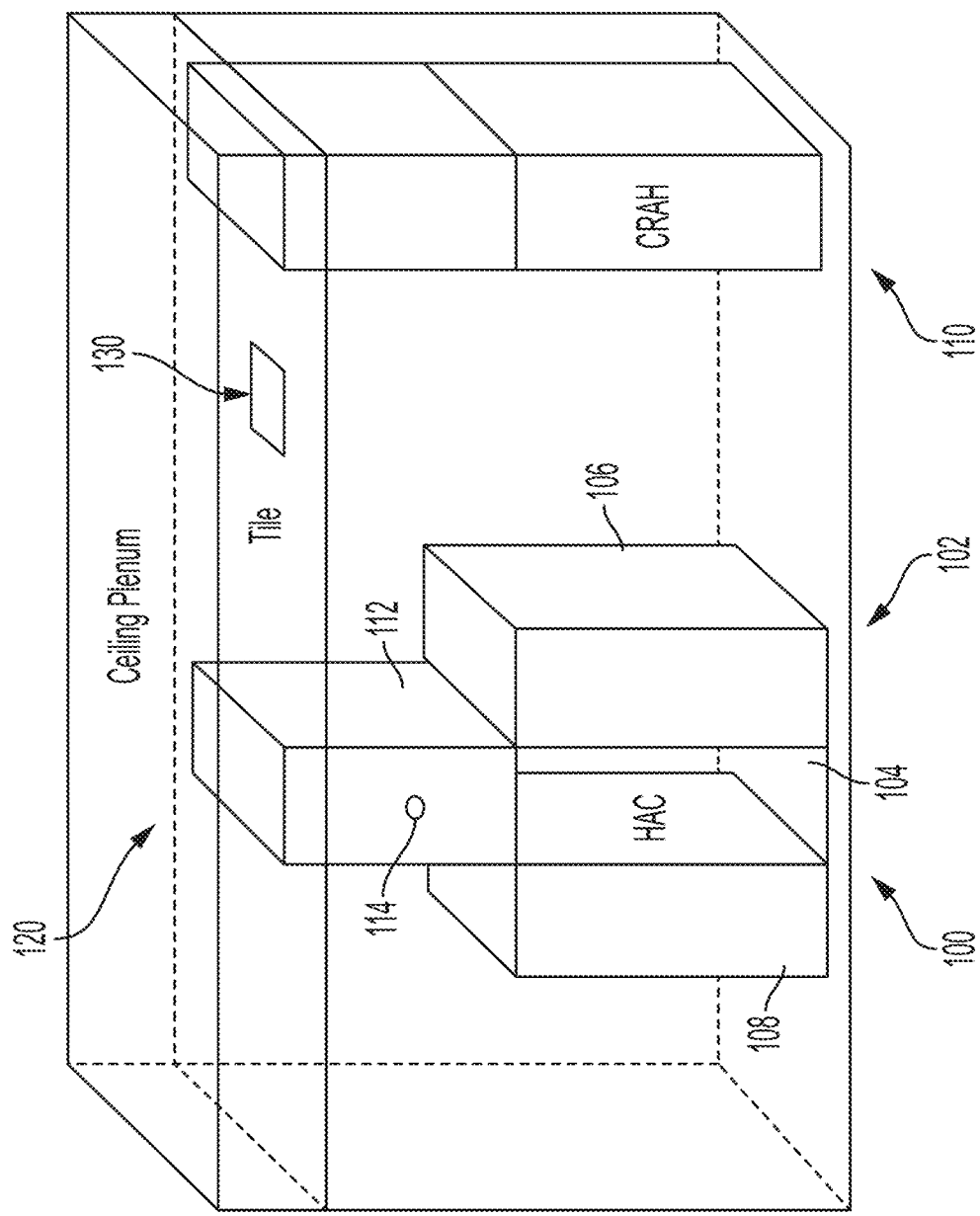
FIG. 1 shows a ceiling-ducted hot-aisle-containment system in accordance with at least one embodiment.

This disclosure is not limited in its application to the details of construction and the arrangement of components set forth in the following descriptions or illustrated by the drawings. The disclosure is capable of other embodiments and of being practiced or of being carried out in various ways. Also, the phraseology and terminology used herein is for description purposes and should not be regarded as limiting. The use of "including," "comprising," "having," "containing," "involving," and variations herein, are meant to be open-ended, i.e. "including but not limited to."

The present disclosure relates generally to a method for air containment management and design, and more specifically, to systems and methods for managing power consumption of cooling equipment related to ceiling-ducted aisle containment air containment systems for data centers. Such systems physically separate cold and hot airflow streams in the data center. Excess cooling airflow is typically supplied to ensure that a worst-case pod of equipment racks receives sufficient airflow. This typically requires an increase in the speed of fans operating with cooling systems, leading to a decrease in overall cost efficiency.

Operating a data center in an energy efficient state typically requires the ability to manage power consumption of both the Information Technology (IT) equipment and cooling equipment under various operational states in a practical, yet accurate manner. Current mathematical models for controlling cooling systems may be roughly grouped into two categories: empirical models and physics-based models. Empirical models may employ past experimental data or approximate trend-type models to predict future behavior without consideration of certain physical principles and may be generally based on measured and/or manufacturer-provided data. Polynomial, exponential, power law, logarithmic, and trigonometric functions as well as look-up tables are commonly used as empirical models. The computational simplicity of empirical models enables fast computations, but since these models are based on fitting experimental data for a specific set of operating conditions, these predictions can be very poor for operating conditions that are outside this specific set. Physics-based models may require detailed knowledge of one or more of the components of the data center and/or the layout of the components being monitored, and therefore, may come at great computational costs and longer simulation times.

In some embodiments, a flow-network-based software tool is utilized to determine airflow imbalances in data center cooling systems and infrastructure. The tool may also be used to identify energy-savings-opportunities associated with proper airflow balancing. Actual airflow balancing may be achieved through the use of dampers installed in the ducts of the airflow system. Damper positions and the total cooling airflow rate may be controlled such that an optimized amount of cooling airflow passes through the system to cool electronic equipment while the cooling system is subjected to minimum backpressure. In some embodiments, when Information Technology (IT) airflow is known, optimized damper positions may be computed analytically. In some embodiments, to account for uncertainties in system models and changes in IT equipment, a closed-loop control system is used, either alone, or in conjunction with a software tool to achieve balance airflow using measured air pressures and CRAH flowrate.

FIG. 1 illustrates an example of a ceiling-ducted hot-aisle-containment system located in a data center in accordance with various embodiments. The Hot-Aisle Containment (HAC) system 100 includes a hot aisle containment pod 102 that includes a hot aisle 104 formed by two rows of equipment racks 106 and 108. The hot aisle containment pod 102 also includes a containment duct 112 positioned above the hot aisle 104. The hot aisle containment system also includes a ceiling plenum 120 and a Computer Room Air Conditioner (CRAH) 110. The ceiling plenum couples the containment duct 112 to the CRAH 110. The containment duct includes a pressure sensor 114 that determines a difference in air pressure outside the containment duct 112 (i.e., in the data center room) to inside the containment duct 112. In some embodiments, the pressure sensor is coupled to a data center control system to provide pressure differential measurements to the data center control system. As shown in FIG. 1, the ceiling plenum may also include a perforated tile 130 that is used to facilitate additional airflow between the room and ceiling plenum. Each of the racks is designed to contain computer servers and other IT equipment.

In one embodiment, the equipment in the racks is configured to draw cooling air from outside the racks and return heated air to the hot aisle 104. The heated air is passed through the containment duct 112 and returned to the CRAH 110 through the ceiling plenum 120. The CRAH 110 includes one or more fans that draw heated air through the ceiling plenum. The CRAH 110 cools the heated air and provides cool air to the data center.

In some embodiments, multiple CRAHs 110 and multiple containment pods 102 may be present in a data center, each coupled to the ceiling plenum. The hot aisle containment system 100 provides a desired hot and cold-air separation while providing cooling redundancy when multiple cooling units are used to draw return air from a common ceiling plenum 120. However, when multiple CRAHs are used, increasing or decreasing the airflow rate of any one cooling unit affects all ducted containment pods in the data center as the ceiling plenum pressure rises or falls more-or-less uniformly. Consequently, there is no individual control of how much IT exhaust (plus leakage) airflow, is drawn from each ducted pod.

In some embodiments disclosed herein, the airflow through each containment pod is controlled individually using dampers, as discussed below, and is properly balanced so that the net cooling airflow may be reduced. With a reduction of net cooling airflow, fan speeds of the CRAHs may be reduced resulting in energy savings. The fan power savings can be significant as the savings in mechanical work for a typical fan reduces with approximately the cube of the flowrate. There may also be savings associated with improved cooling-system (e.g., chiller) efficiency which is realized when the airflow rate is reduced resulting in an increase of the temperature of the return air. Warmer return air temperatures improve cooling-system efficiency, as such systems must ultimately reject heat to the ambient environment.

Figure 2:
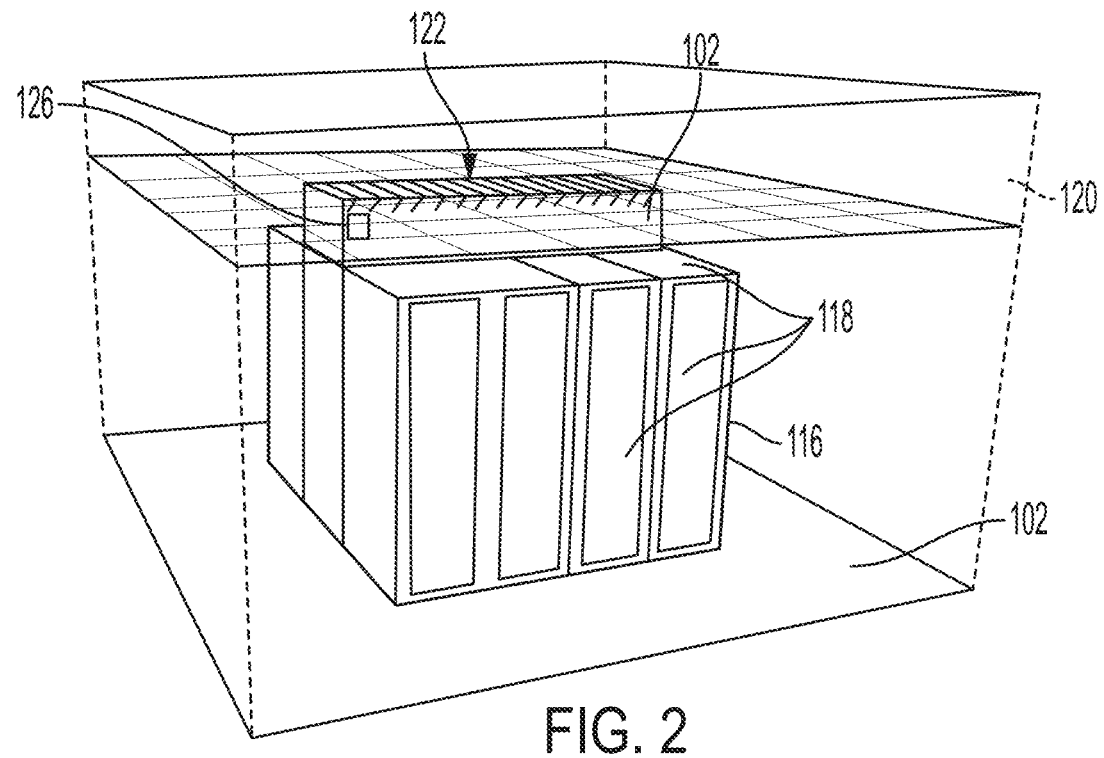
FIG. 2 shows a hot-aisle-containment system used in at least one embodiment.
Figure 3:
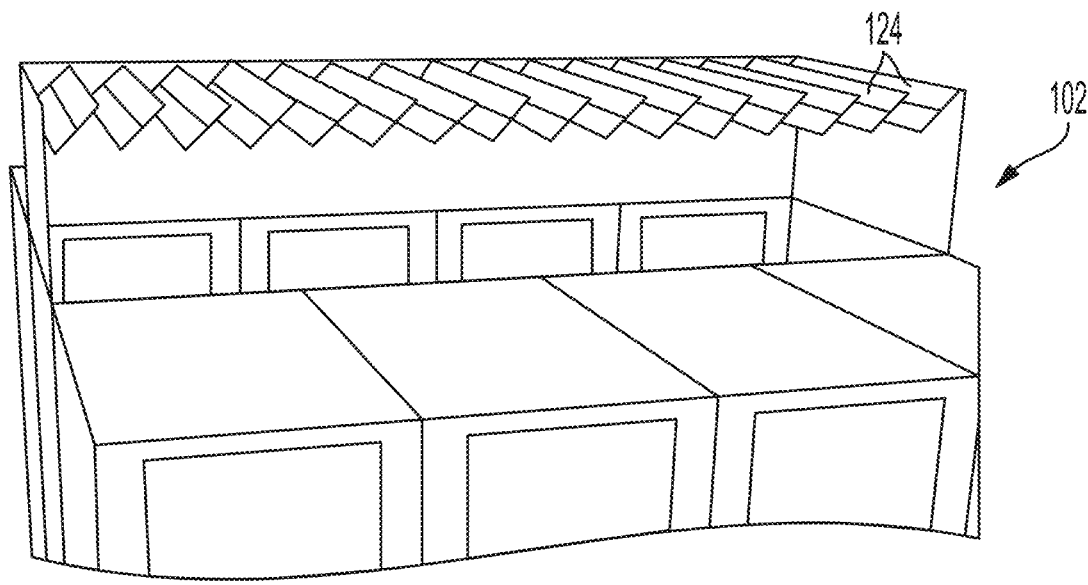
FIG. 3 shows a louvered damper system used with at least one embodiment.

FIGS. 2 and 3 show additional views of the containment pod 102. The containment pod 102 includes a metal frame 116 which provides support for equipment racks 118, and the containment duct 112. The metal frame 116 may also provide support for overhead cable trays, electrical gear, and other equipment. The metal frame 116 provides a freestanding approach in which racks of a variety of sizes may be easily added to or removed. In one embodiment, the frame may be implemented using a HyperPod available from Schneider Electric IT, Corporation of West Kingston, R.I.

As shown in FIGS. 2 and 3, the top of the containment duct 112 includes a damper system 122. The damper system 122 includes a number of adjustable louvers 124 that extend across the top of the containment duct 112 between the containment duct and the ceiling plenum 120. The louvers 124 are fully adjustable between a fully open position, a closed position, and a number of positions between the open position and the closed position. In the open position, the louvers 124 provide low resistance to the flow of air between the containment duct 112 and the ceiling plenum 120. In the closed position, the louvers 124 may almost completely block airflow. In FIG. 3, the louvers 124 are shown in a 45 degree orientation. In one embodiment, the damper system 122 includes an actuator 126 that controls the position of the louvers 122 in response to a signal received from a data center control system.

Figure 4:
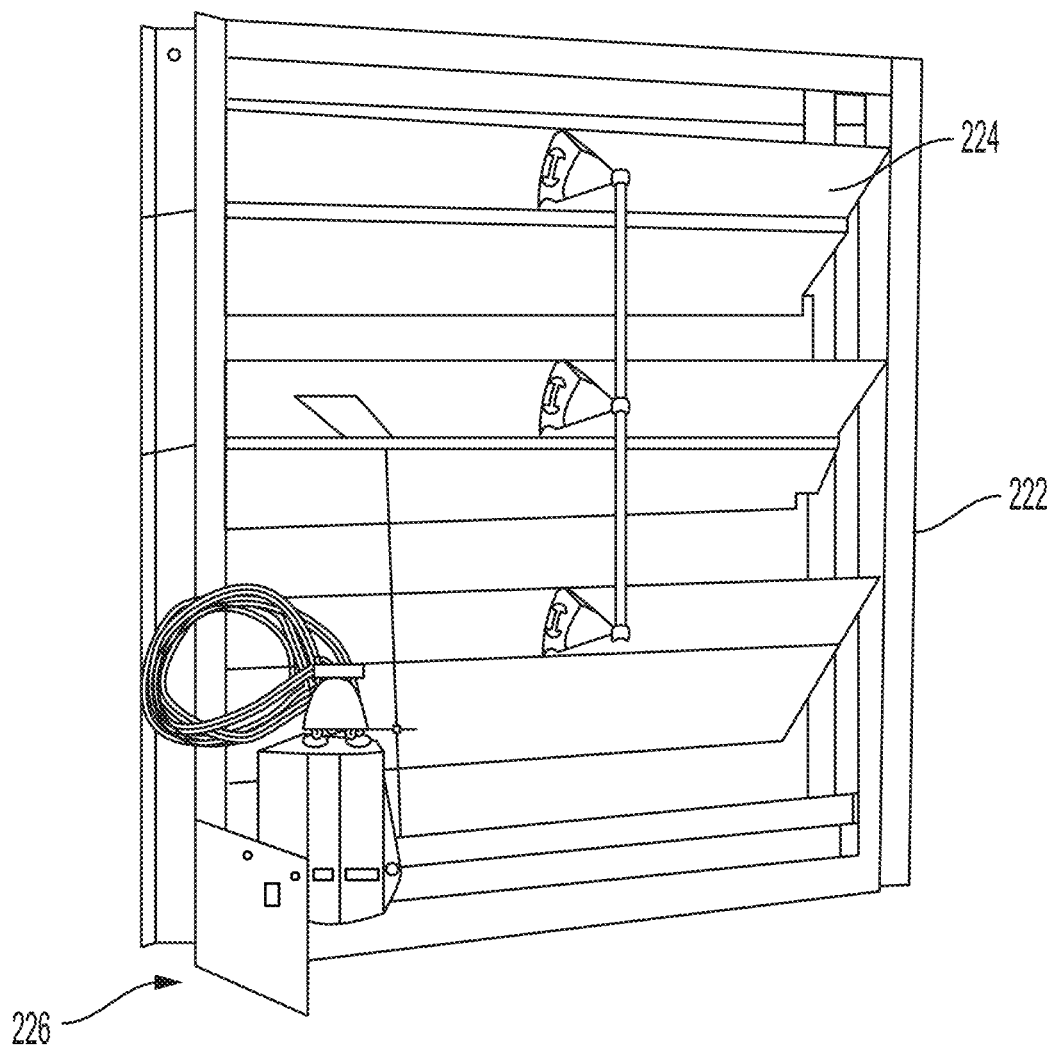
FIG. 4 shows a louvered damper system that may be used with at least one embodiment

FIG. 4 illustrates an example of a commercially available louvered damper system 222 that may be used in addition to or in place of the damper system 122. The damper system 222 includes adjustable lovers 224 and a controller 226 In one embodiment a damper system and associated controller is configured for the containment duct 112 of each containment pod 102.

In one embodiment, control of the damper systems may be automated using a data management control system. In other embodiments, some or complete manual (including static, fixed-position) control may be provided. Using the data center management control system, the amount of airflow resistance in each duct may be adjusted to provide tuning of individual pod airflow.

In at least some embodiments discussed herein, the use of damper systems allows the flow resistance of each containment pod to be adjusted until the amount of airflow passing into the ceiling plenum equals the airflow of the IT equipment in the containment pod. With all containment pods of a containment system balanced, total cooling-system airflow can be reduced to the sum of all the pod airflows plus the amount of leakage airflow through the ceiling plenum.

In some embodiments, airflows in a containment system are modelled using a flow network model (FNM) rather than using more complex techniques based on computational fluid dynamics. Fluid network models for data centers are known and are analogous to simple electric circuits. The fluid-flow counterparts to voltage drop $\Delta V$ and current I are pressure drop $\Delta P$ and volumetric flow rate Q respectively. However, in electric circuits, $\Delta V$ is proportional to I (as shown in Equation (1)), while, with most fluid-flow applications, $\Delta P$ is proportional to $Q^2$. In both cases, the proportionality constant is called the "resistance" which is given the symbol R in electric circuits and $\alpha$ in our FNM discussed here. We have:

$$\Delta V = IR \text{ (electric circuits)} \quad (1)$$

$$\Delta P = \alpha Q^2 \text{ (fluid flow)} \quad (2)$$

Figure 5:
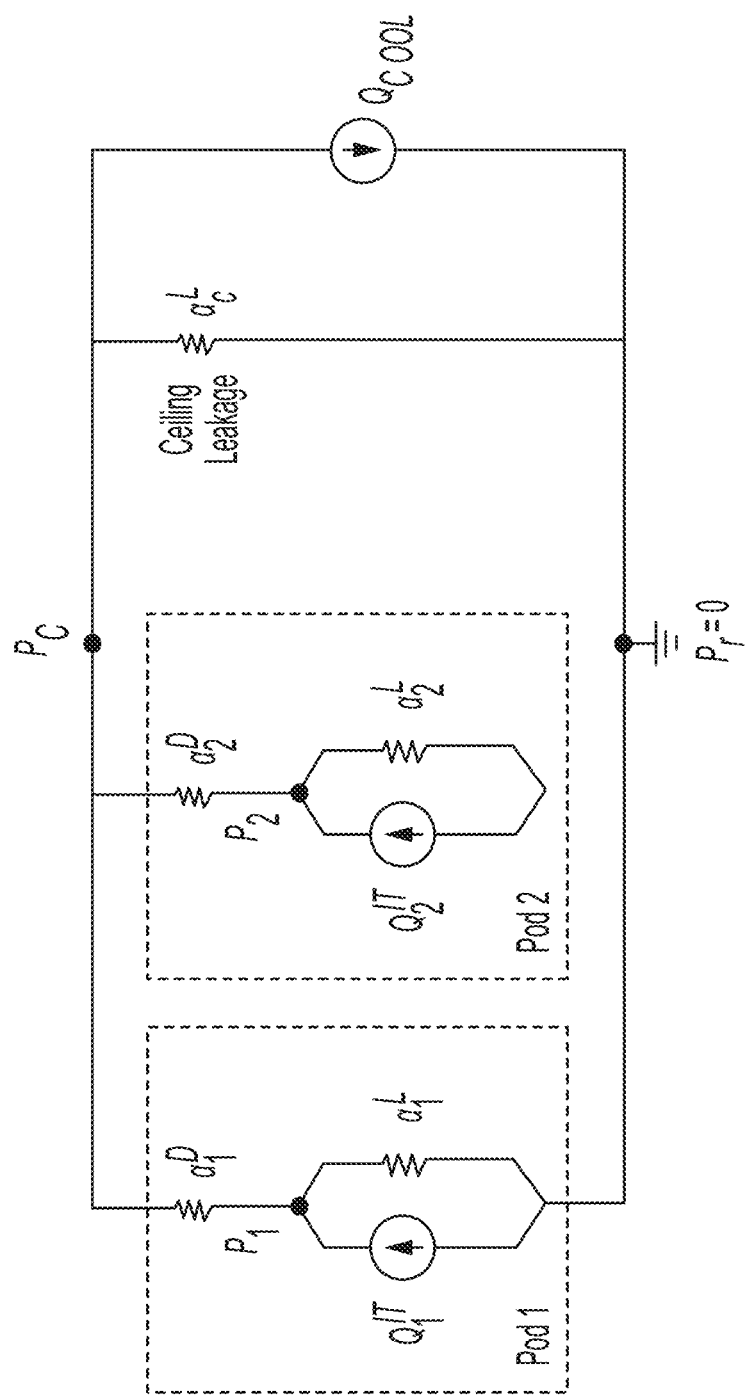
FIG. 5 shows an example of a physics-based Flow Network Model (FNM) diagram for a ceiling-ducted hot-air containment system in accordance with at least one embodiment.

The ceiling-ducted hot-aisle-containment application may be represented as an FNM as shown in FIG. 5. Although only two ceiling-ducted pods are shown, the network may be generalized to any number of pods. Also included in the model, is a flow path representing the leakage through the ceiling plenum. The total cooling airflow extracted from the ceiling plenum and then supplied to the room by all cooling sources is $Q_{cool}$. Similarly, the total IT airflow of each pod $Q_i^{IT}$ is an aggregation of all IT airflow within pod i. Each ducted-pod model includes two resistances: a leakage resistance al and a duct/damper resistance $\alpha_i^D$. The former represents the aggregate flow resistance between the hot aisle at pressure $P_i$ and the room, while the latter represents the resistance between $P_i$ and the ceiling plenum. The ceiling pressure $P_c$ and the data-center room pressure $P_r$ are both assumed to be uniform values here with the latter at the reference value of zero. In general, if $P_c$ and $P_r$ vary appreciably in space, local pressures may be determined by other means and connected to the FNM as described. For example, CFD can be employed for a greenfield design and measurements can be employed for the control of an existing data center.

With the simple two-pod network of FIG. 5, three equations are required to solve for the three unknown pressures $P_1$, $P_2$, and $P_c$. The three equations represent airflow balances in the two pods and the ceiling plenum, respectively:

$$Q_1^{IT} = \text{sgn}(P_1 - P_c)\sqrt{\frac{|P_1 - P_c|}{\alpha_1^D}} - \text{sgn}(-P_1)\sqrt{\frac{|P_1|}{\alpha_1^L}} \quad (3)$$

$$Q_2^{IT} = \text{sgn}(P_2 - P_c)\sqrt{\frac{|P_2 - P_c|}{\alpha_2^D}} - \text{sgn}(-P_2)\sqrt{\frac{|P_2|}{\alpha_2^L}} \quad (4)$$

$$Q_{cool} = \text{sgn}(P_1 - P_c)\sqrt{\frac{|P_1 - P_c|}{\alpha_1^D}} + \text{sgn}(P_2 - P_c)\sqrt{\frac{|P_2 - P_c|}{\alpha_2^D}} + \text{sgn}(-P_c)\sqrt{\frac{|P_c|}{\alpha_C^L}} \quad (5)$$

where the sgn function is used to establish the proper airflow direction. Note that Equations 3-5 form a set of non-linear simultaneous equations to which there is no general analytical solution. However, the equations are "well behaved" and are easily solved numerically by many commercial software packages. Once $P_1$, $P_2$, and $P_c$ are determined, the airflow through any resistance element of the network is easily determined from Equation 2.

For a data center with n pods, there are n+1 equations to be solved for n+1 pressures; n are of the form of Equations 3 and 4, representing airflow in and out of each pod and one is of the form of Equation 5, representing the airflow in and out of the ceiling plenum.

Resistance values for dampers and other data center structures may be determined in embodiments of the invention in a number of ways as will now be discussed. Flow resistance characteristics are often conveniently expressed as dimensionless and area-independent loss coefficients f defined by:

$$\Delta P = \frac{f}{2}\rho V^2 \quad (6)$$

where $\rho$ is the air density (assumed to be 1.19 kg/m$^3$) and V is the air velocity just upstream of the resistance. Comparing, Equations 1 and 5, for flow through a resistance of normal area A, f and $\alpha$ are related by:

$$\alpha = \frac{f\rho}{2A^2} \quad (7)$$

Racks and hot aisles are assumed to be 2 ft (610 mm) and 3 ft (910 mm) wide, respectively, for purposes of computing A in at least some embodiments discussed herein.

Dropped-ceiling leakage resistance for various ceiling-construction types and is reproduced here in Table 1.

TABLE 1

Dropped-Ceiling Loss Coefficient

| Construction | $f^c$ |
|---|---|
| Leaky | 8,000 |
| Typical | 100,000 |
| Well Sealed | 200,000 |

The leakage resistance $\alpha_i^L$ of a pod comprised of eight (two rows of four) racks is known from measurements. The racks used in the measurement were Netshelter SX AR3100 racks available from Schneider Electric IT, Corporation of West Kingston, R.I., and were 42U (height) racks 600 mm (width) by 1070 mm (depth). Most leakage between a pod and a room is associated with the racks themselves—rather than the containment structure, and the racks in a pod are arranged in a parallel flow topology. Consequently, the total pod leakage resistance $\alpha_{pop}^L$ is related to the individual-rack leakage resistance $\alpha_{rack}^L$ as shown in Equation 8:

$$\alpha_{rack}^L = n^2 \alpha_{pod}^L \quad (8)$$

where n is the number of racks in the pod. Equation 8 is simply the flow analogy to $1/R_{eq} = 1/R_1 + 1/R_2 + \ldots + 1/R_n$ for electrical resistances in parallel where all n resistances are equal. Table 2 shows the measured resistance values along with additional computed values for reference.

TABLE 2

Rack and Pod Leakage Resistances

| Pod | $\alpha^L \left( \dfrac{Pa}{(m^3/s)^2} \right)$ | $\alpha^L \left( \dfrac{in\,H_2O}{cfm^2} \right)$ |
|---|---|---|
| 8 Racks* | 1.9 | $1.7 \times 10^{-9}$ |
| 10 Racks | 1.2 | $1.1 \times 10^{-9}$ |
| 12 Racks | 0.84 | $0.76 \times 10^{-9}$ |
| Per-Rack Basis | 120 | $110 \times 10^{-9}$ |

*measured experimentally

Figure 6:
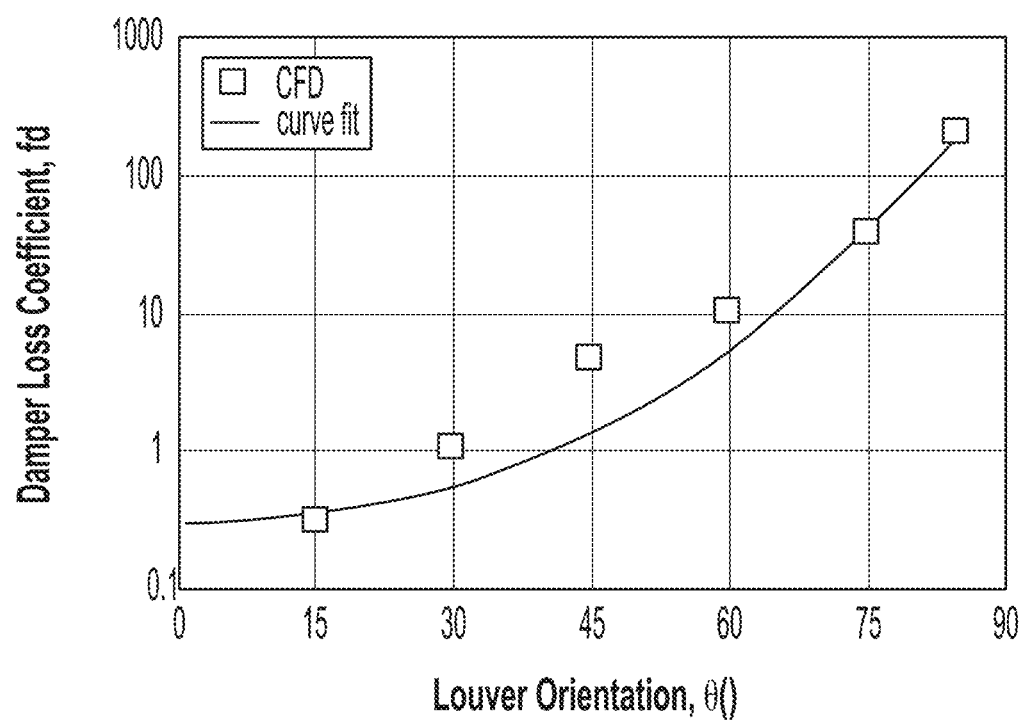
FIG. 6 shows an example of a flow resistance chart for a damper system used with at least one embodiment.

In at least one embodiment, damper systems having louvers are used to balance airflows in pods, however, in other embodiments other damper systems (e.g., perforated screens, sliding plates with area through which airflow may pass, etc.) may be used to introduce resistance to balance airflows. The loss characteristics of dampers and other devices can be obtained through CFD analysis and through experimentation. For the damper system 122, shown in FIG. 2, which features thin (2D) 6-inch-(150 mm) wide louvers 124 which pivot about their center, the pressure drop across the damper system at several different louver orientations at a nominal airflow velocity of 1 m/s (200 fpm) has been determined using CFD. The loss coefficient $f^d$ was computed from Equation 6 and is plotted in FIG. 6. In its fully "open" (0°) position $f^d$ is around 0.3 and increases as the damper is closed. The damper loss coefficient may be approximated by the following empirical curve fit:

$$f^d = 0.3 e^{2.15 \times 10^{-4} \theta^{2.33}} \quad (9)$$

where θ is the louver orientation in degrees. Theoretically, $f^d$ should become infinite as the damper is fully closed and airflow is completely blocked; however, Equation 9 is used in at least some embodiments to determine a louver orientation θ which corresponds to a desired damper resistance $f^d$. Further, unless a pod is inactive, practical damper settings should be significantly less than 90°.

In examples discussed herein, $\alpha_i^D$ represents the flow resistance of the duct itself plus the damper, if present. The resistance of the duct alone is estimated in on a per-rack basis as 8.8 Pa/(m³/s)² (7.9×10⁻⁹ in H₂O/cfm²) which translates to a duct loss coefficient of $f^D = 1.15$ for pods of all sizes. The fully-open-damper-plus-duct resistance loss coefficient is then $f^{D,o} = f^d + f^D = 0.3 + 1.15 = 1.45$. This translates into the fully-open-damper-plus-duct resistances $\alpha^{D,o}$ shown in Table 3 for typical pod sizes.

TABLE 3

Fully-Open-Damper-Plus-Duct Resistances

| Pod | $\alpha^{D,o} \left( \dfrac{Pa}{(m^3/s)^2} \right)$ | $\alpha^{D,o} \left( \dfrac{in\,H_2O}{cfm^2} \right)$ |
|---|---|---|
| 8 Racks | 0.17 | $1.6 \times 10^{-10}$ |
| 10 Racks | 0.11 | $0.99 \times 10^{-10}$ |
| 12 Racks | 0.077 | $0.69 \times 10^{-10}$ |

If the actual IT airflow rates and various system resistances are known or estimated, the optimal pod-by-pod damper settings can be determined directly from the FNM. The discussion below focuses on the simple two-pod example of FIG. 5, but the same approach may be used to generalize to other scenarios.

In the balanced state, the airflow drawn through the duct and into the ceiling plenum matches the total pod IT airflow; the leakage airflow through each pod must then be zero, which, in turn, implies that the pod pressure equals the room pressure: $P_i = P_r = 0$. In this case, Equations 3 and 4 reduce to:

$$\alpha_1^D = \frac{|P_c|}{(Q_1^{IT})^2} \text{ and } \alpha_2^D = \frac{|P_c|}{(Q_2^{IT})^2} \text{ or,} \quad (10)$$

$$|P_c| = \alpha_1^D Q_1^2 = \alpha_2^D Q_2^2 \quad (11)$$

Equation 11 can be used in some embodiments to set one damper resistance (louver orientation) relative to another; however, an additional condition is used to establish absolute damper resistance. In at least some embodiments, total-system pressure drop is minimized by setting one pod (or multiple identical pods) to its (their) minimum pressure drop $\alpha_i^{D,o}(Q_i^{IT})^2$—and then increase the pressure drop through the other ducts by adjusting their damper resistance until Equation 11 is satisfied. Consequently, the process is limited by the maximum $\alpha_i^{D,o}(Q_i^{IT})^2$ and $|P_c|$ is determined using Equation 12:

$$|P_c| = \text{Max}\{\alpha_1^{D,o}(Q_1^{IT})^2, \alpha_2^{D,o}(Q_2^{IT})^2\} \quad (12)$$

This maximum pressure drop corresponds to the pod with maximum IT airflow in the case that all pod/duct/damper systems are otherwise identical. With $|P_c|$ known, all optimal damper settings can be determined by computing the required resistance from Equation 10 and then relating this to a damper position, e.g., via FIG. 6 and Equation 9. Finally, the total (minimized) cooling airflow is then the sum of all optimized pod airflows plus the ceiling leakage airflow:

$$Q_{cool} = Q_1^{IT} + Q_2^{IT} + \sqrt{\frac{|P_c|}{\alpha_c^L}} \quad (13)$$

Using the process described above to balance airflows may result in energy savings based on the ability to reduce CRAH fan rates. The fractional fan power savings may be estimated as:

$$\text{Fractional Fan Power Savings} = 1 - \left(\frac{Q_{cool}^{opt}}{Q_{cool}^{cur}}\right)^3 \quad (13)$$

where $Q_{cool}^{cur}$ and $Q_{cool}^{opt}$ are the current and optimized cooling airflow rates, respectively.

Additional energy may be saved due to improved cooling-system efficiency associated with increased return temperatures resulting from a reduction in total cooling airflow.

Figure 7:
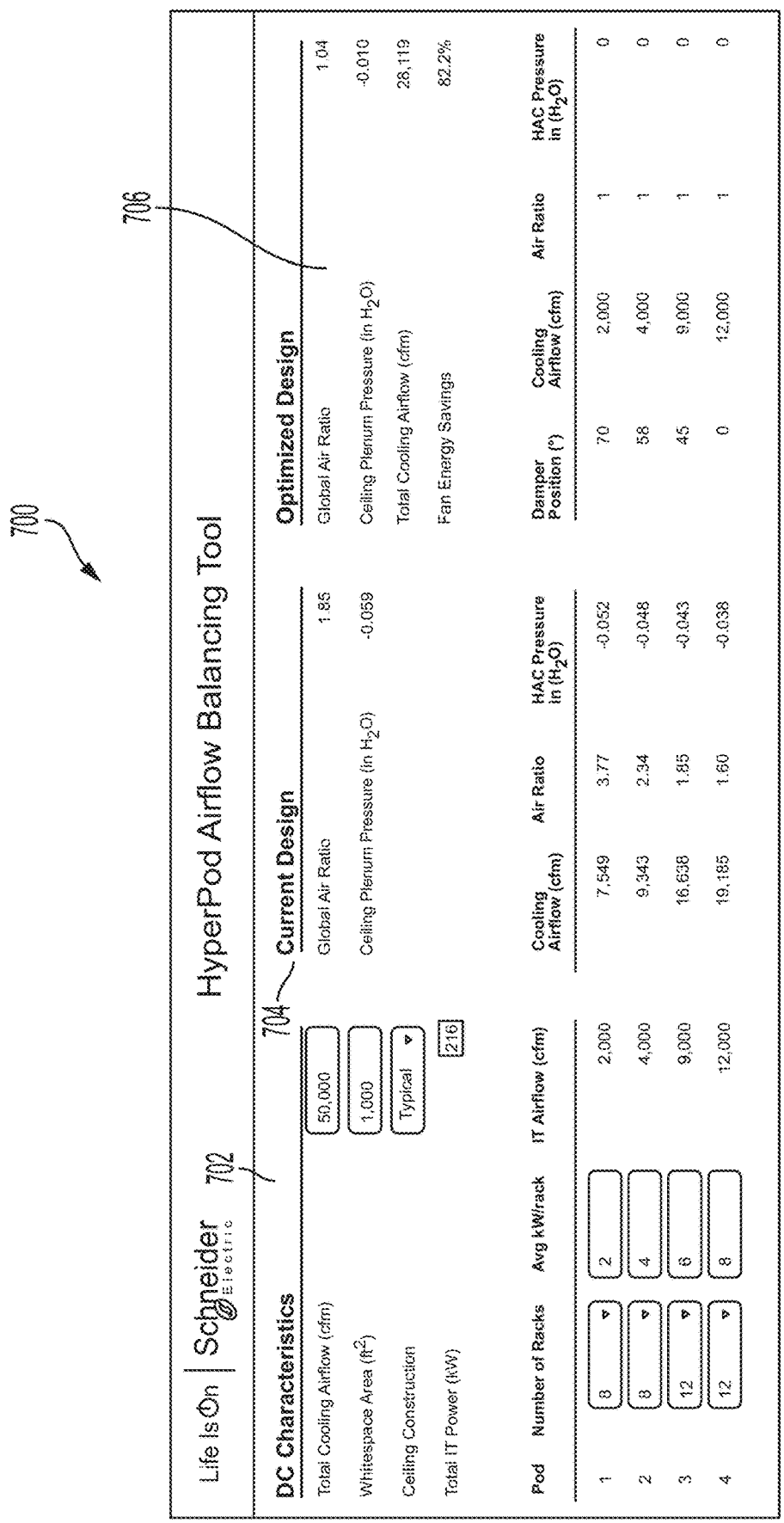
FIG. 7 shows an example of a user interface for a tool used with at least one embodiment.

In one embodiment, flow network model and damper calculations discussed above are incorporated into a software tool having a display screen 700 as shown in FIG. 7. The software tool can be used in the design of a new data center and may be used to optimize the operation of an existing data center. The tool can use one of a number of commercially available products to solve the non-linear equations discussed above for pressure and provide as outputs damper positions and total cooling airflow required for an optimized design. The software tool may be incorporated in a data center management system located in a data center or remote from a data center.

As shown in FIG. 7, the display 700 includes three sections including an input section 702, a current design section 704 and an optimized design section 706. The input section is used to allow a user to input Data Center (DC) characteristics. The data center characteristics inputs include total cooling airflow, whitespace area, and ceiling construction type. The latter two quantities are used to define the ceiling leakage, as discussed above. In the Example in FIG. 7, the data center includes four Hot Aisle Containment (HAC) systems also referred to as pods. Pod-level inputs include the number of racks per pod and the average rack power. The airflow for each pod is determined by the tool assuming 125 cfm (212 m³/hr) of airflow for each kW of power dissipation. All flow-resistance values α employed in the tool are consistent with the data presented above. In the example in FIG. 7, the data center is a 1,000 ft² data center that includes four-pods including both 8 and 12 rack pods with average rack densities that vary from pod to pod.

The current design section 704 shows the cooling performance of the example data center prior to optimization by the tool. As shown in the current design section, total cooling airflow is 50,000 cfm with a global air ratio of 1.85, i.e., 85% more airflow is provided by the cooling system than required by the IT equipment. In existing data centers, air ratios greater than 2 are not uncommon. In the fully-open-damper configuration of the current design, pod air ratios vary between 1.60 and 3.77.

The optimized design section 706 shows the results and settings for an optimized design using dampers and techniques described herein. In the optimized design, one or more dampers is installed in each of the pods, and the damper settings (in degrees) are shown in FIG. 7. The optimized design also shows the total cooling airflow required, which for the example is 28,119 cfm. The speed of fans in CRAHs of the data center are controlled to reduce the airflow from 50,000 cfm to 28,119 cfm in the example of FIG. 7, resulting in an 82% savings in fan energy costs. In this optimized state, all pod pressures are zero, pod air ratios are unity, and the total cooling airflow is 28,119 cfm (47,700 m³/hr). The damper for pod 4 is set to 0° (fully open) and all other pods are balanced relative to the damper of pod 4 with damper settings ranging from 45°-70°. The optimized global air ratio is 1.04, which is slightly larger than unity due to airflow leakage through the dropped ceiling.

In embodiments described above a physics-based model is implemented in a tool for determining damper positions which results in balanced airflows in ceiling-ducted-containment data centers. Specifically, if the various physical parameters (IT and cooler airflow rates, and all flow resistances) are known, then methods and tools in accordance with embodiments described above determine the optimized damper positions and corresponding minimum total cooler airflow. At this optimized state, all the hot aisle or "pod" pressures will be equal to the surrounding room ambient pressure and the ceiling plenum pressure will be at a relative vacuum.

While at least some embodiments described above provide improvements in data center design and cooling performance, as will now be described, further embodiments can improve on the cooling performance for a given data center by taking into account actual parameters of the data center and equipment that may vary from the parameters used above.

Figure 8:
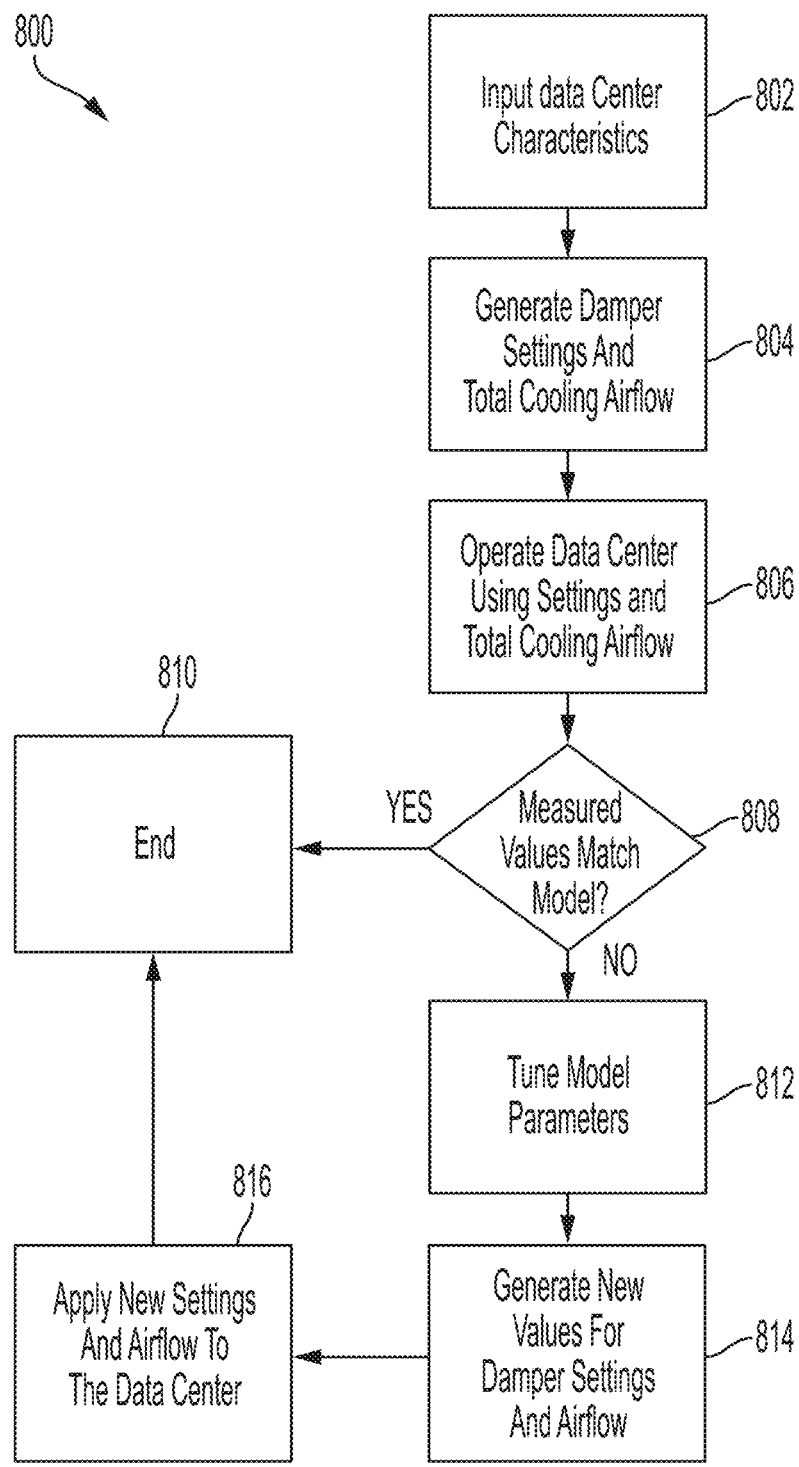
FIG. 8 shows a flowchart of a process in accordance with one embodiment.

FIG. 8 provides a flowchart of a process 800 for controlling cooling performance of a data center using a data center management system in accordance with one embodiment. In act 802, data center characteristics are input into the system. The characteristics include data center characteristics described above with reference to FIG. 7. At act 804, the system uses the flow network model techniques described above to generate damper settings and total cooling airflow for the data center. At act 806, the cooling system of the data center is operated using the generated damper settings and airflow. After the data center equipment has run for some time to achieve a steady state, measured pressure values in the data center can be compared with initial pressure values generated at act 804. In one embodiment, the pressure values may be measured using, for example, pressure sensors mounted inside each hot aisle containment duct, such as the pressure sensor 114 shown in FIG. 1. Pressure sensors may also be contained in the above ceiling cooling return duct. At act 808, each of the measured values are compared with a corresponding initial pressure value to obtain error pressure values. If the magnitude of any of the error pressure values exceeds a threshold, then the process proceeds to act 812, otherwise, the process ends at act 810.

Figure 9:
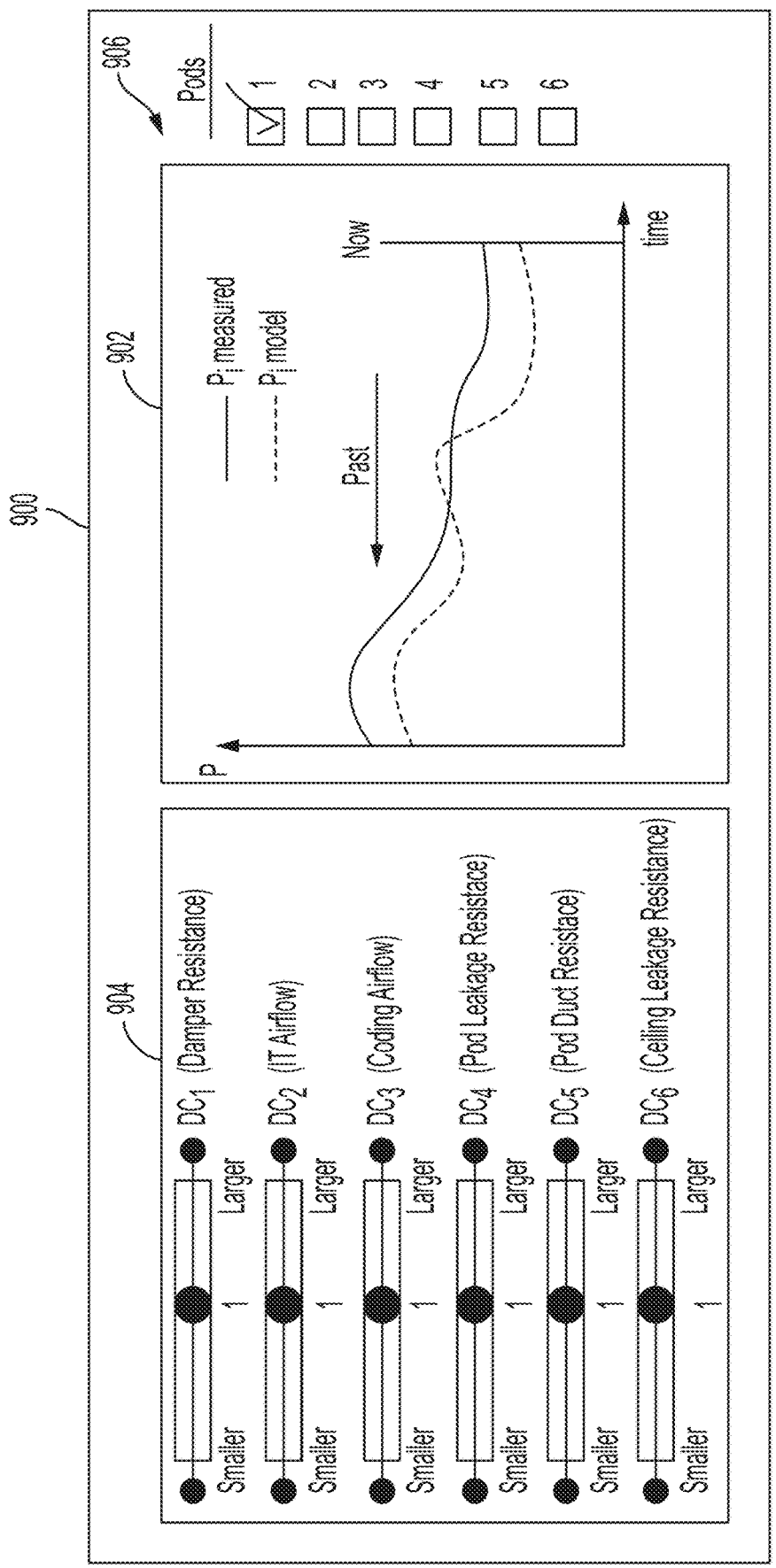
FIG. 9 shows a user interface used with at least one embodiment.

At act 812, parameters of the model are tuned to more closely match the modeled pressures to the measured pressures. In one embodiment, the tuning of parameters may be achieved by an operator of the data center using a graphical user interface of the data center management system. An example user interface 900 is shown in FIG. 9. The user interface 900 includes a section 902 showing selected measured pressures, modelled pressures and the error pressure values. In other embodiments, the pressures may be shown as bar charts, other types of charts or in tables. The user interface also includes a tuning section 904 having slider bars for adjusting coefficients for six tunable parameters of the model, and a pod selection section 906.

As shown in FIG. 9, the tunable parameters include damper resistance, IT airflow, cooling airflow, rack leakage resistance, duct resistance and ceiling resistance, each of which is discussed further below. Initially, the coefficients are set to 1, and can be set to smaller or larger values by a user. The pod selection section allows a user to select a pod for which the modelled and measured pressures are shown in section 902. In some embodiments, fewer or more than κ tunable parameters may be used. An operator can adjust the parameters using the slider bars until all of the error pressure values are within the threshold discussed above. In some embodiments, the data center's cooling efficacy may increase if parameters are tuned after the data center has operated for a period of time (e.g., three months) and/or operated under different conditions (e.g., during light and heavy data-processing periods. Further, values of coefficients obtained as a result of the tuning process may be used for other data centers and equipment, either existing or during a design process.

In another embodiment, at act 812, the data center management system may automatically adjust the parameters to reduce the error pressure values. The system may adjust the parameters using, for example, a least-squares method fit or other techniques. In addition, the data center management system may use more sophisticated techniques such as machine learning to automatically adjust the tuning parameters.

At act 814, after the parameters of the model have been tuned, new values for the damper settings and airflow can be generated by the system using the tuned parameters. At act 816, the new settings are applied to the data center, and at act 818, the process ends. In other embodiments, the data center management system may continue to compare measured pressures with modelled pressures (based on the tuned parameters) and repeat acts 806 to 816.

In some embodiments, the data center management system may receive measured values for airflow from cooling units and may receive measurements or estimations of IT power in essentially real time and may rerun the model (act 804 of process 800) using the measured values and either provide updated control settings, or automatically adjust cooling units and dampers.

In process 800 described above, six tunable parameters are discussed. Each of these is described in greater detail below. As discussed above, the damper resistance is typically characterized in terms of a loss coefficient f which will depend on louver angle $\theta$: $f=f(\theta)$ where $f(\theta)$ is a minimum value (resistance) when the damper is fully open at 0° and goes to infinity as $\theta$ approaches 90° (fully closed). For model-tuning purposes, a coefficient is used to provide adjustability above and beyond the input damper resistance value $f=f(\theta)$. For example, $f=k_1 f(\theta)$ where $k_1$ is a tuning parameter that can be adjusted by a data center management system operator or automatically adjusted by the data center management system.

IT airflow is frequently assumed to vary in proportion to the (e.g., real-time measured) IT power as $Q_{IT}[\text{cfm}]=(125 \text{ cfm/kW})P[\text{kW}]$. Like the damper resistance, we can include an additional constant $k_2$ to provide adjustability. For example, $Q_{IT}[\text{cfm}]=k_2(125 \text{ cfm/kW})P[\text{kW}]$ where $k_2$ is a tuning parameter that can be adjusted by a data center management system operator or automatically adjusted by the data center management system.

Total cooling airflow may be obtained directly from cooling units or inferred through fan RPM monitoring or other means. In any case, an additional constant $k_3$ is included in some embodiments as an additional multiplier on the airflow value to provide a measure of adjustability by a data center management system operator or automatically by the data center management system.

As discussed above, the total rack leakage coefficient $\alpha^L$ (for an entire pod) is simply the equivalent resistance of individual rack resistances in parallel. Assuming all individual racks have identical resistance, $\alpha_{pod}^L = \alpha_{rack}^L / n^2$ where n is the number of racks in the (ceiling-ducted hot aisle) pod. Similarly, the leakage resistances can be scaled based on rack dimensions. In the end, this greatly reduces the number of independent rack-leakage values that must be supplied and ultimately tuned for the model. The value $\alpha_{pod}^L$ can be tuned directly or may be multiplied by an additional tuning constant, e.g., $k_4$, that is tuned by a data center management system operator or automatically tuned by the data center management system.

Like the rack leakage resistance, duct resistance can be scaled based on duct size (i.e., based on how many racks are in each pod) so that fewer independent duct resistance values need to be tuned in the process 800. The duct resistance $\alpha_{pod}^D$ can be tuned directly or may be multiplied by an additional tuning constant, e.g., $k_5$ that is tuned by a data center management system operator or automatically tuned by the data center management system.

Ceiling leakage resistance, like damper resistance, is typically determined by assuming a particular f value. The value can be tuned directly or may be multiplied by an additional tuning constant, e.g., $k_6$, that is tuned by a data center management system operator or automatically tuned by the data center management system.

At least some embodiments described above, provide systems and processes for determining data center cooling settings using flow network methods. An additional embodiment for controlling the cooling of installed data centers using hot aisle containment systems will now be described with reference to FIG. 10, which shows a process 1000. The process 1000 may be implemented in a data center management system. The process 1000 is a closed-loop control process for setting damper positions in a ceiling-ducted hot-air containment system having pressure sensors for measuring differential pressures inside each containment system relative to room pressure. In at least one embodiment, the process 1000 may be used to iteratively tune fan speed (total cooling airflow) and damper positions.

Figure 10:
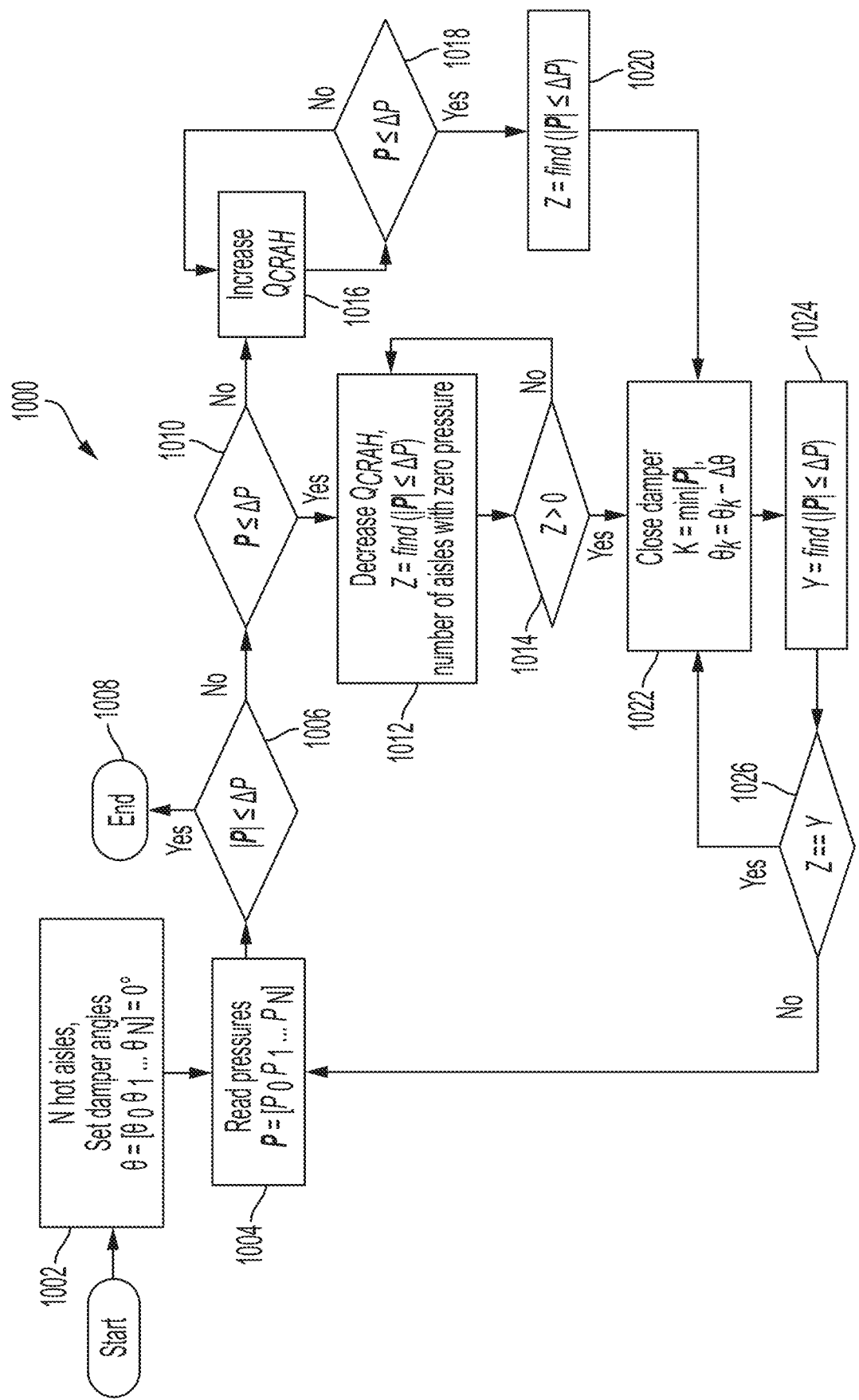
FIG. 10 shows a flowchart of a process in accordance with one embodiment.

The process 1000 is used to control n-hot-aisles in a data center. In the diagram of FIG. 10, P is the vector of N hot aisle pressures. $\theta$ is the vector of N damper angles. $\Delta P$ is a small tolerance for measurement noise and other uncertainties. Z is the number of hot-aisles near-zero pressure before tuning damper angles. The notation find ($|P| \le \Delta P$) is an abbreviation for a process of determining the number of hot aisles with near-zero pressure. Y is the number of hot-aisles with near-zero pressure after a damper adjustment. Every time the fan speed or the damper angles are changed, new measurements for P may be taken.

Initially, in act 1002 of the process 1000, all damper angles are set to 0°—fully open. At act 1004, differential pressure sensors measure the real-time pressures inside each contained hot-aisle relative to room pressure. The process is used to tune the dampers and cooling airflow such that the measured differential pressures become zero, within a small tolerance, for all contained hot-aisles.

At act 1006, a determination is made whether the absolute value of all of the measured pressure values are less than the tolerance $\Delta P$. If the outcome of act 1006 is "YES," then the process ends at act 1008, and not further adjustment of the dampers or airflow is needed. If the outcome of act 1006 is "NO," then the process 1000 proceeds to act 1010. At act 1010, a determination is made whether the measured pressures are all less than $\Delta P$. If the result of act 1010 is "YES," then this indicates that all hot aisles have sufficient cooling airflow, and the process at act 1012 will reduce the fan speed of one or more cooling units. At act 1014, a determination is made whether at least one hot aisle has near zero pressure. If the outcome of act 1014 is "No," then acts 1012 and 1014 will be used to iteratively decrease fan speed until the outcome of act 1014 is "YES."

If the outcome of act 1010 is "NO," then this indicates that the pressure in one or more aisles is positive, and the system will iteratively increase fan speed until the outcome of act 1018 is "YES." At act 1020, the process 1000 determines the number of near zero pressure hot aisles, and the process moves to act 1022.

At act 1022, excluding hot aisles for which the pressure is near zero, the process determines which hot aisle has the smallest differential pressure and will further close the damper associated with that hot aisle. At acts, 1024 and 1026, the process checks whether the number of hot-aisles with near-zero pressure changes or not, by comparing Z and Y. If the number of hot-aisles with near-zero pressure has not changed, the damper will be closed further at act 1022 until the number of hot-aisles with near-zero pressure changes and the outcome of act 1026 is "NO," at which point the process returns to act 1004.

In various embodiments each pass through the process 1000 which returns to act 1004 is referred to as one iteration. The process 1000 will continue to iterate until all ceiling-ducted hot-aisles have near-zero pressures. The process 1000 adjusts the CRAH fan actuator and only one damper actuator per iteration and uses fixed step sizes for the control action. The process 1000 ensures that the damper positions monotonically approach their optimal positions. Even with these constraints, this process can converge to an optimal solution for four hot-aisles in less than 30 iterations in a simple example test case. A system with a larger number of hot-aisle pods might require a less-constrained (e.g. adjusting multiple damper actuators at once and using a larger step size for the control action) process to converge in a reasonable number of iterations, with the complication that the convergence to an optimal solution may no longer be monotonic.

Figure 11:
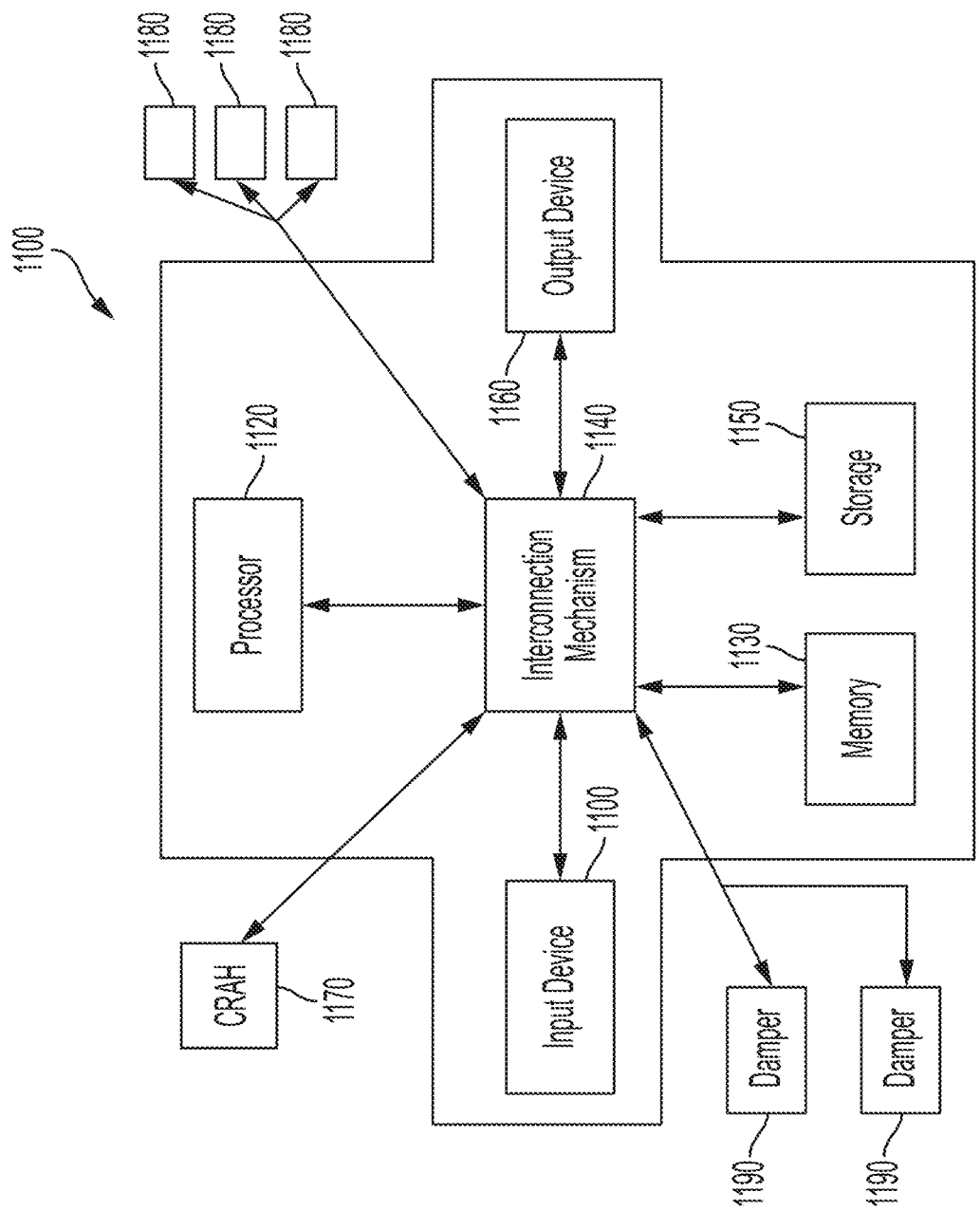
FIG. 11 is a functional block diagram of a data center management system in accordance with at least one embodiment.

Embodiments disclosed herein may be operated using one or more data center management systems, such as data center management system 1100 shown in FIG. 11. The data center management system 1100 includes a processor 1120 connected to one or more memory devices 1130, such as a disk drive, memory, or other device for storing data. Memory 1130 may be used for storing programs and data during operation of the data management system 1100. The data management system 1100 may also include a storage system 1150 that provides additional storage capacity. Components of data management system 1100 are coupled by an interconnection mechanism 1140, which may include one or more busses (e.g., between components that are integrated within the same machine) and/or a network (e.g., between components that reside on separate discrete machines). The interconnection mechanism 1140 enables communications (e.g., data, instructions) to be exchanged between system components and with external components.

Data center management system 1100 also includes one or more input devices 1110, for example, a keyboard, mouse, trackball, microphone, touch screen, and one or more output devices 1160, for example, a printing device, display screen, speaker. The output devices may be used to display screens associated with tool and processes discussed above. In addition, data center management system 1100 may contain one or more interfaces (not shown) that connect the data management system 1100 to a communication network (in addition or as an alternative to the interconnection mechanism 1140).

As shown in FIG. 11, the data center management system 1100 in one embodiment is coupled to a CRAH 1170, multiple sensors 1180 and multiple dampers 1190. As discussed above, the data center management system is used to control one or more CRAHs and dampers based on processes in accordance with at least one embodiment. The data center management system 1100 may also receive data from the CRAH 1170 and dampers 1190 indicative of settings of the devices. The multiple sensors 1180 may include differential pressure sensors coupled to hot aisle containment systems, may include other pressure sensors, temperature sensors and other types of sensors.

Figure 12:
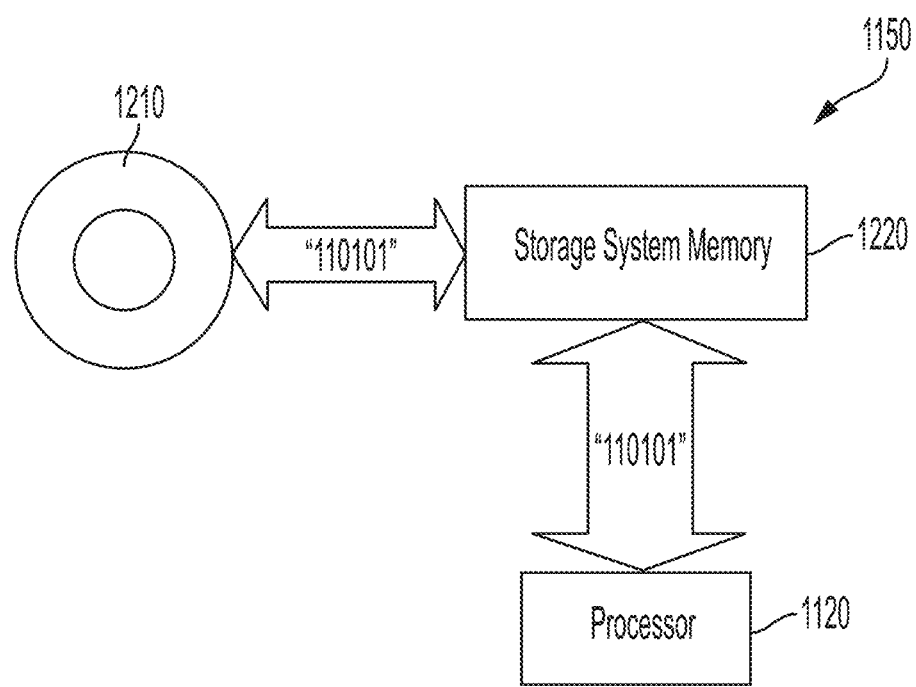
FIG. 12 is a functional block diagram of a storage system that may be used with the data center management system of FIG. 11.

The storage system 1150, shown in greater detail in FIG. 12, may include a computer readable and writeable non-volatile recording medium 1210 in which signals are stored that define a program to be executed by the processor or information stored on or in the medium 1210 to be processed by the program to perform one or more functions associated with embodiments described herein. The medium may, for example, be a disk or flash memory. In operation, the processor causes data to be read from the nonvolatile recording medium 1210 into another memory 1220 that allows for faster access to the information by the processor than does the medium 1210. This memory 1220 may be a volatile, random access memory such as a Dynamic Random-Access Memory (DRAM) or Static RAM (SRAM). The memory 1220 may be located in storage system 1150, as shown, or in memory system 1130. The processor 1120 generally manipulates the data within the integrated circuit memory 1130, 1220 and then copies the data to the medium 1210 after processing is completed. A variety of mechanisms are known for managing data movement between the medium 1210 and the integrated circuit memory element 1130, 1220, and the disclosure is not limited thereto. The disclosure is not limited to a particular memory system 1130 or storage system 1150.

The data center management system may include specially-programmed, special-purpose hardware, for example, an application-specific integrated circuit (ASIC). Aspects of the disclosure may be implemented in software, hardware or firmware, or any combination thereof. Further, such methods, acts, systems, system elements and components thereof may be implemented as part of the computer system described above or as an independent component. Any computer systems used in various embodiments of this disclosure may be, for example, computers such as those based on Intel PENTIUM-type processor, Motorola PowerPC, Sun UltraSPARC, Hewlett-Packard PA-RISC processors, or any other type of processor.

Although data center management system 1100 is shown by way of example as one type of computer system upon which various aspects of the disclosure may be practiced, it should be appreciated that aspects of the disclosure are not limited to being implemented on the data center management system as shown in FIG. 11. Various aspects of the disclosure may be practiced on one or more computers having a different architecture or components shown in FIG. 11. Further, where functions or processes of embodiments of the disclosure are described herein (or in the claims) as being performed on a processor or controller, such description is intended to include systems that use more than one processor or controller to perform the functions.

Data center management system 1100 may be implemented using a computer system that is programmable using a high-level computer programming language. Data center management system 1100 may be also implemented using specially programmed, special purpose hardware. In the data center management system 1100, processor 1120 may be a commercially available processor such as the well-known Pentium class processor available from the Intel Corporation. Many other processors are available. Such a processor usually executes an operating system which may be, for example, the Windows 95, Windows 98, Windows NT, Windows 2000, Windows ME, Windows XP, Vista, Windows 7, Windows 10, or progeny operating systems available from the Microsoft Corporation, MAC OS System X, or progeny operating system available from Apple Computer, the Solaris operating system available from Sun Microsystems, UNIX, Linux (any distribution), or progeny operating systems available from various sources. Many other operating systems may be used.

The processor and operating system together define a computer platform for which application programs in high-level programming languages are written. It should be understood that embodiments of the disclosure are not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

One or more portions of the data center management system may be distributed across one or more computer systems coupled to a communications network. For example, in at least one embodiment, the data center management system 1100 may be remote from a data center but communicatively coupled to the data center to receive sensor data and provide control information to components of the data center in accordance with embodiments disclosed herein. For example, various aspects of the disclosure may be distributed among one or more computer systems configured to provide a service (e.g., servers) to one or more client computers, or to perform an overall task as part of a distributed system. For example, various aspects of the disclosure may be performed on a client-server or multi-tier system that includes components distributed among one or more server systems that perform various functions according to various embodiments of the disclosure. These components may be executable, intermediate (e.g., IL) or interpreted (e.g., Java) code which communicate over a communication network (e.g., the Internet) using a communication protocol (e.g., TCP/IP).

It should be appreciated that the disclosure is not limited to executing on any particular system or group of systems. Also, it should be appreciated that the disclosure is not limited to any particular distributed architecture, network, or communication protocol.

Various embodiments of the present disclosure may be programmed using an object-oriented programming language, such as SmallTalk, Java, C++, Ada, or C # (C-Sharp). Other object-oriented programming languages may also be used. Alternatively, functional, scripting, and/or logical programming languages may be used, such as BASIC, ForTran, COBoL, TCL, or Lua. Various aspects of the disclosure may be implemented in a non-programmed environment (e.g., documents created in HTML, XML or other format that, when viewed in a window of a browser program render aspects of a graphical-user interface (GUI) or perform other functions). Various aspects of the disclosure may be implemented as programmed or non-programmed elements, or any combination thereof.

Embodiments of systems and methods described above are generally described for use in relatively large data centers having numerous equipment racks; however, embodiments of the disclosure may also be used with smaller data centers and with facilities other than data centers.

In embodiments of the present disclosure discussed above, results of analyses may be described as being provided in real-time. As understood by those skilled in the art, the use of the term real-time is not meant to suggest that the results are available immediately, but rather, are available quickly giving a designer the ability to try a number of different designs over a short period of time, such as a matter of minutes.

At least some embodiments are described for use in data centers having hot aisle containment systems. These embodiments may also be used in data centers that have cold aisle containment systems. In data centers having cold aisle containment system, the pressures and airflows associated with contained cold aisles may be monitored and controlled to more efficiently control air flow in the cold aisle containment systems.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

The invention claimed is:

1. A system for controlling airflow in a facility having a ceiling-ducted aisle airflow containment system having a first damper system for controlling airflow, the system comprising:
    an input to receive parameters related to airflow in the facility, wherein the parameters include at least one airflow resistance value for a device in the facility;
    an output to provide output data including at least one setting for one or more controllable devices in the facility; and
    one or more processors configured to receive the parameters related to airflow, determine airflow values associated with the airflow containment system and based on the airflow values, generate the at least one setting for the one or more controllable devices, including at least one setting for the first damper system.

2. The system for controlling airflow of claim 1, wherein the ceiling-ducted aisle airflow containment system includes two containment pods, including a first containment pod and a second containment pod, the first containment pod having the first damper system and the second containment pod having a second damper system, and wherein the one or more processors is configured to generate at least one setting for the second damper system.

3. The system for controlling airflow of claim 2, wherein the facility includes at least one cooling device, and wherein the one or more processors are further configured to generate at least one setting for the cooling device based on the airflow values.

4. The system for controlling airflow of claim 3, wherein the at least one cooling device includes a fan, and the one or more processors are configured to generate a fan speed setting for the fan.

5. The system for controlling airflow of claim 2, wherein the first containment pod includes a first pressure sensor and the second containment pod includes a second pressure sensor, and wherein the input is configured to receive a first measured pressure value from the first sensor and a second measured pressure value from the second sensor and generate the at least one setting for the first damper system and the at least one setting for the second damper system based on the first measured sensor value and the second measured sensor value.

6. The system for controlling airflow of claim 5, wherein the one or more processors are configured to determine a first model pressure value associated with the first containment pod and a second model pressure value associated with the second containment pod using a model of the data center, compare the first model pressure value and the second model pressure value with the first measured pressure value and the second measured pressure value to obtain a comparison result.

7. The system for controlling airflow of claim 6, further comprising a user interface, and wherein the user interface includes at least one control configured to receive input from a user to adjust parameters of the model.

8. The system for controlling airflow of claim 1, wherein the system includes a first pressure sensor, wherein the input is configured to receive a first measured pressure value from the first pressure sensor wherein the one or more processors are configured to determine a first model pressure value using a model of the data center, compare the first model pressure value with the first measured pressure value to obtain a comparison result, and wherein the one or more processors are configured to adjust parameters of the model based on the comparison result.

9. A non-transitory computer-readable medium storing thereon sequences of computer-executable instructions for controlling airflow in a facility, the sequences of computer-executable instructions including instructions that instruct at least one processor to:
receive parameters related to airflow in the facility, wherein the parameters include at least one airflow resistance value for a device in the facility;
determine airflow values associated with an airflow containment system in the facility, the airflow containment system including a first damper system;
based on the airflow values, generate at least one setting for the one or more controllable devices contained in the facility, including at least one setting for the first damper system.

10. The non-transitory computer-readable medium of claim 9, wherein the ceiling-ducted aisle airflow containment system includes two containment pods, including a first containment pod and a second containment pod, the first containment pod having the first damper system and the second containment pod having a second damper system, and wherein the instructions to instruct the at least one processor further include instructions to generate at least one setting for the second damper system.

11. The non-transitory computer-readable medium of claim 10, wherein the facility includes at least one cooling device, and wherein the instructions to instruct the at least one processor further include instructions to generate at least one setting for the cooling device based on the airflow values.

12. The non-transitory computer-readable medium of claim 11, wherein the at least one cooling device includes a fan, and wherein the instructions to instruct the at least one processor further include instructions to generate a fan speed setting for the fan.

13. The non-transitory computer-readable medium of claim 11, wherein the first containment pod includes a first pressure sensor and the second containment pod includes a second pressure sensor, and wherein the instructions to instruct the at least one processor further include instructions to receive a first measured pressure value from the first sensor and a second measured pressure value from the second sensor and generate the at least one setting for the first damper system and the at least one setting for the second damper system based on the first measured sensor value and the second measured sensor value.

14. The non-transitory computer-readable medium of claim 13, wherein the instructions to instruct the at least one processor further include instructions to determine a first model pressure value associated with the first containment pod and a second model pressure value associated with the second containment pod using a model of the data center, compare the first model pressure value and the second model pressure value with the first measured pressure value and the second measured pressure value to obtain a comparison result.

15. The non-transitory computer-readable medium of claim 14, wherein the instructions to instruct the at least one processor further include instructions to generate a user interface having at least one control configured to receive input from a user to adjust parameters of the model.

16. The non-transitory computer-readable medium of claim 9, wherein the instructions to instruct the at least one processor further include instructions to receive a first measured pressure value, determine a first model pressure value using a model of the facility, compare the first model pressure value with the first measured pressure value to obtain a comparison result, and adjust parameters of the model based on the comparison result, and wherein the instructions to instruct the at least one processor further include instructions to adjust parameters of the model based on the comparison result.

17. A method of balancing airflow in a facility having a ceiling-ducted hot aisle containment system, comprising:
receiving a plurality of differential pressure measurements from a plurality of pressure sensors each associated with one of a plurality of hot aisle structures;
identifying that at least one hot aisle structure of the plurality of hot aisle structures has a differential pressure greater than a threshold level;
providing control signals to adjust a Cooling Room Air Handler (CRAH) associated with the ceiling-ducted hot aisle containment system based on the plurality of differential pressure measurements;
receiving a differential pressure measurement for a first hot aisle structure of the plurality of hot aisle structures after a CRAH adjustment; and
providing control signals to control a first damper associated with the first hot aisle structure wherein providing control signals to control the CRAH includes iteratively changing a fan rate of the CRAH until at least one of the plurality of hot aisle structures has a differential pressure less than the threshold level.

18. The method of claim 17, wherein each of the plurality of hot aisle structures includes a damper, and wherein the method further comprises initially setting the damper of each of the plurality of hot aisle structures to a maximum open position.

19. The method of claim 17, wherein providing control signals to control the CRAH includes iteratively decreasing a fan rate of the CRAH until at least one of the plurality of hot aisle structures has a differential pressure less than the threshold level.

20. The method of claim 17, wherein providing control signals to control the CRAH includes iteratively increasing a fan rate of the CRAH until each of the plurality of hot aisle structures has sufficient airflow based on differential pressure measurements.

\* \* \* \* \*